United States Patent [19]

Kammerer et al.

[11] Patent Number: 4,745,300

[45] Date of Patent: May 17, 1988

[54] TWO-WIRE SWITCH

[75] Inventors: Heinz Kammerer, Ostfildern; Peter Dolderer, Esslingen, both of Fed. Rep. of Germany

[73] Assignee: Gebhard Balluff Fabrik Feinmechanischer Erzeugnisse GmbH & Co., Fed. Rep. of Germany

[21] Appl. No.: 43,151

[22] Filed: Apr. 27, 1987

[30] Foreign Application Priority Data

May 3, 1986 [DE] Fed. Rep. of Germany ....... 3615052

[51] Int. Cl.4 ............................................. H03K 17/00
[52] U.S. Cl. ..................................... 307/112; 307/321; 307/257; 323/324; 323/325; 323/326
[58] Field of Search ............... 307/112, 256, 257, 321, 307/284; 323/324, 325, 326

[56] References Cited

U.S. PATENT DOCUMENTS

| | | | |
|---|---|---|---|
| 3,146,392 | 8/1964 | Sylvan | 323/326 |
| 3,226,627 | 12/1965 | Fromkin | 307/257 X |
| 3,328,606 | 6/1967 | Pinckaers | 307/321 X |
| 3,333,112 | 7/1967 | Vercellotti | 307/284 X |
| 3,372,328 | 3/1968 | Pinckaers | 307/321 X |
| 3,438,023 | 4/1969 | Apitz | 307/284 X |
| 3,486,038 | 12/1969 | Skamter et al. | 323/325 X |
| 3,487,292 | 12/1969 | Tibbetts | 323/326 |
| 3,509,377 | 4/1970 | Clark et al. | 307/257 X |
| 4,168,443 | 9/1979 | Periot | 361/179 X |
| 4,600,877 | 7/1986 | Soderholm | 323/324 |

Primary Examiner—William M. Shoop, Jr.
Assistant Examiner—Paul Ip
Attorney, Agent, or Firm—Kramer, Brufsky & Cifelli

[57] ABSTRACT

The invention relates to a two-wire switch for connecting a load to an ac voltage source, and, in particular, to a two-wire switch with an auxiliary voltage source. A capacitor acting as charge storage device can be charged by the auxiliary voltage source which operates on the principle of phase angle control. In accordance with the invention, a series connection comprising a threshold element which can be brought into the conducting state when there is a prescribed minimum voltage across the capacitor, and a diode is inserted into a control current circuit for a controllable semiconductor device on the input side of the bridge.

11 Claims, 2 Drawing Sheets

TWO-WIRE SWITCH

The invention relates to a two-wire switch for connecting a load to an ac voltage source comprising: a bridge rectifier circuit connected in the operating state on the input side to the ac voltage source; on the output side of the bridge circuit a semiconductor circuit controllable on its input side by an initiator and having on its output side a switchable semiconductor path which can be brought into the conducting state in dependence upon the operating state of the initiator; and on the input side of the bridge circuit a controllable semiconductor device located within the load circuit when the load is in the connected state, with its control electrode located in a control current circuit including the switchable semiconductor path.

A two-wire switch of this kind is known from the company publication "Siemens Components 23 (1985), page 81, and comprises a triac as controllable semiconductor device. In the operating state, i.e., when an ac voltage source and a load, in particular, the operating coil of a relay, are externally connected to the two terminals of the two-wire switch, this triac is arranged in series with the load and with the ac voltage source in the load circuit of the switch.

An advantage of this known two-wire switch is that there is only a voltage drop of approximately 1 V across the triac, while the circuit having a thyristor on the output side of the bridge, which until then was the most expedient circuit, a residual voltage of at least 4 to 5 V was to be anticipated since this circuit always has two diodes of the bridge rectifier located in the load circuit in addition to the thyristor. On the other hand, this adanatge is only made possible in the known circuit by the switchable path of a transistor suited for high voltage being arranged on the output side of the bridge circuit.

A two-wire switch having on the output side of the bridge circuit an auxiliary voltage source serving to generate a relatively low auxiliary voltage for the semiconductor circuit is known from German Offenlegungsschrift (unexamined Patent Application) No. 3,320,975. This known circuit has a transistor with high voltage handling capacity on the output side of the semiconductor bridge and and the load current flows across the switchable path of the transistor when the load circuit is closed. In this case, too, the disadvantage is that the diodes of the bridge circuit are located in the load circuit and there is, therefore, a greater voltage drop across the load circuit than in the above-described two-wire switch having a triac on the input side of the bridge circuit.

Starting from the state of the art described hereinabove, the object underlying the invention is to obtain with a minimum of component expenditure a low residual voltage in the load circuit in a two-wire switch having an auxiliary voltage source on the output side of the bridge circuit.

This object is attained in accordance with the invention by connecting an auxiliary voltage source which serves to generate a relatively low, pulsating dc voltage as auxiliary voltage, and by which a capacitor acting as charge storage device can be charged, to the output side of the bridge circuit, and by inserting a series connection comprising a threshold element which can be brought into the conducting state when there is a prescribed minimum voltage across the capacitor, and a diode, into the control current circuit between the control electrode of the controllable semiconductor device and the switchable semiconductor path.

An important advantage of the inventive two-wire switch is that a very low residual voltage is obtained in the load circuit as the load current only flows through the controllable semiconductor device serving as switch and not through the diodes of the bridge circuit. Also, the bridge circuit need only be designed for currents of a few milliamperes. At the same time, the high voltage on the input side of the bridge is kept away from the switchable semiconductor path on the output side of the bridge by the diode arranged in series with the threshold element and this switchable path may, therefore, be the collector-emitter path of a transistor which is not a high-voltage transistor, but need only be designed for the relatively low auxiliary voltage.

On of the following components:
Zener diode, triggering diode, diac is preferably used as threshold element, but, in particular, a Zener diode, since Zener diodes with closely graduated threshold voltages are commercially available at a moderate price.

In a first advantageous embodiment of an inventive two-wire switch, the controllable semiconductor device on the input side of the bridge may be a thyristor having a second thyristor connected in antiparallel relation to it. The control electrode of the second thyristor is connected via a further diode to the connection point of the threshold element and the diode associated with the first thyristor in such a way that the two diodes are poled in the same direction in relation to the connection point.

An advantage of this circuit variant is that thyristors with a correspondingly high power and voltage handling capacity are comparatively inexpensive and have a low space requirement. They also require only relatively low control and holding currents.

In a further development of the inventive two-wire switch, the controllable semiconductor device may be a transistor having a second transistor connected in antiparallel relation to it. The base of the second transistor is connected via a further diode to the connection point of the threshold element and the diode associated with the first transistor in such a way that the two diodes are poled in the same direction in relation to the connection point. Also, each transistor has a diode at the collector terminal serving as protection against incorrect poling.

Further details and advantages of the invention are explained hereinbelow with reference to drawings, in which.

Figure 1:
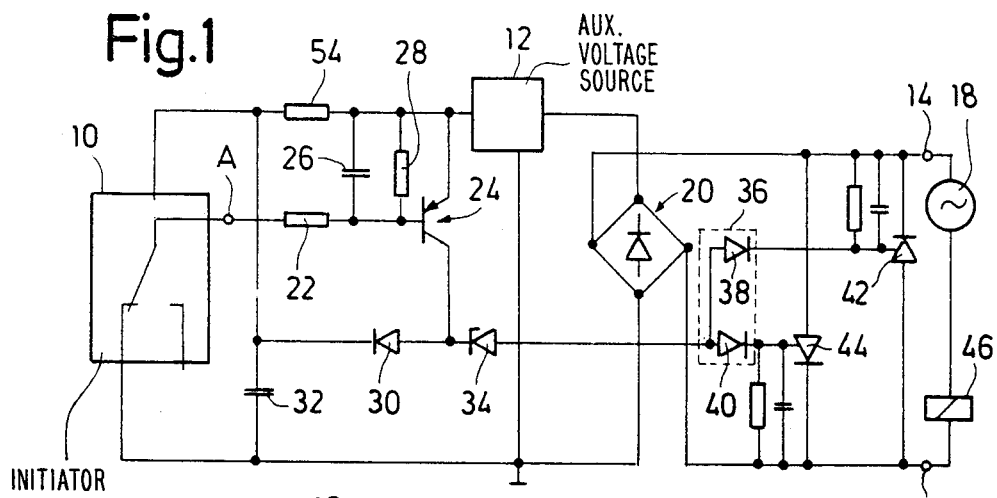
FIG. 1 is a circuit diagram, partly in the form of a block circuit diagram, of a two-wire switch according to the invention.

The circuit shown in FIG. 1 comprises an initiator 10, for example, a common inductive proximity switch such as marketed by the Applicant company under designation BES 517-300 S 141.

Figure 1A:
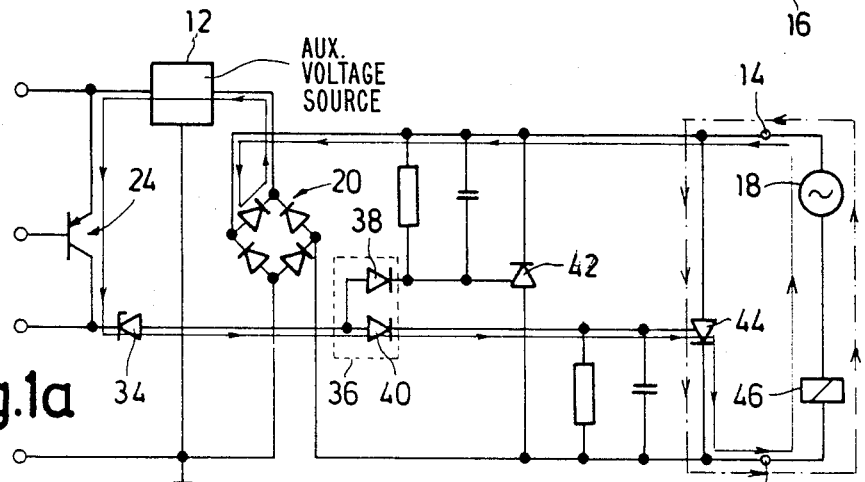
FIG. 1a is a section of the circuit diagram shown in FIG. 1 illustrating the current flow in the control circuit and in the load circuit during a positive half cycle of an ac voltage at the switch terminals.
Figure 1B:
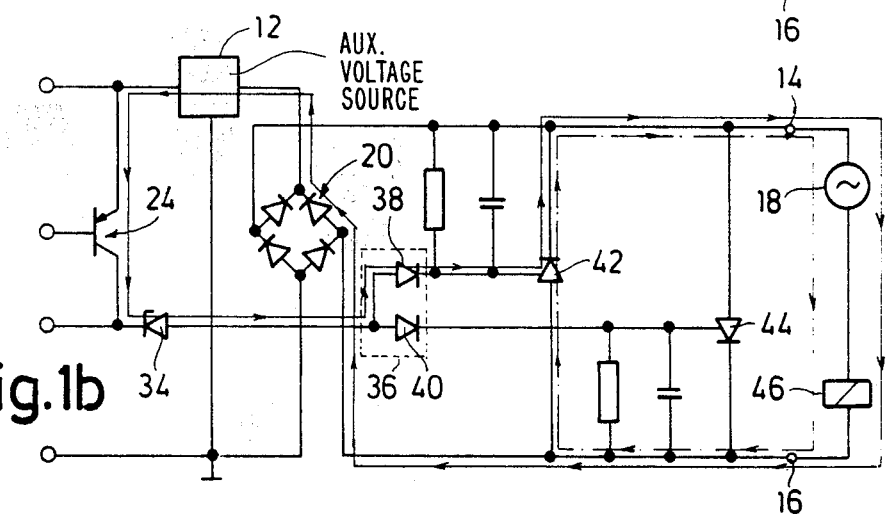
FIG. 1b is a section of the circuit diagram shown in FIG. 1 illustrating the current flow in the control circuit and in the load circuit during a negative half cycle of an ac voltage at the switch terminals.

Initiator 10 is connected, on the one hand, to reference potential (ground) and, on the other hand, to the output of an auxiliary voltage source 12 where a stabilized supply voltage of, for example, approximately +10 V is available. A description of such an auxiliary voltage source is to be found, for example, in German Offenlegungsschrift (unexamined Patent Application) No. 3,320,975. In the case of the auxiliary voltage source described therein, the auxiliary voltage is obtained from the rectified ac voltage at external terminals 14, 16 of the two-wire switch on the principle of phase angle control. In that case, as in the illustrated embodiment, rectification of the ac voltage originating from an ac voltage source 18 is carried out by a rectifier bridge 20 comprised, in the conventional manner, of four diodes, as illustrated in FIGS. 1a and 1b.

Initiator 10 comprises an output A at which mainly the reference voltage or the positive supply voltage is present, depending on the switched state of the diagrammatically illustrated switch. Output A of initiator 10 is connected via resistor 22 to the base of transistor 24 whose emitter is conencted to the output of auxiliary voltage source 12. An emitter-base capacitor 26 and an emitter-base resistor 28 are arranged, in the usual manner, between emitter and base. The emitter of transistor 24 is connected, on the one hand, to the output of auxiliary voltage source 12 and, on the other hand, via resistor 54 to one plate of a capacitor 32 whose other plate is connected to reference potential. Capacitor 32 serves as charge storage device for supplying initiator 10 when there is no voltage on the input side of bridge 20, as will be explained in further detail hereinbelow. The collector of transistor 24 is connected, on the one hand, via diode 30 to that plate of capacitor 32 which is remote from reference potential and, on the other hand, via Zener diode 34 to the input of decoupling circuit 36. In the illustrated embodiment, decoupling circuit 36 is comprised of two diodes 38, 40. Their anodes are connected to each other and to the input of decoupling circuit 36 and their cathodes are each connected to the control electrode of a controllable diode, namely a thyristor, designated 42 and 44, respectively. In the inventive switch, the two thyristors 42, 44 are arranged in antiparallel relation to each other between external terminals 14, 16, and the usual gate/cathode resistor and gate/cathode capacitor are each arranged parallel to the control electrode/cathode path.

As shown in FIG. 1, a load 46 is connected in series with ac voltage source 18. In accordance with the main purpose for which two-wire switches according to the invention are used, load 46 is illustrated as operating coil of a relay.

To generate the auxiliary voltage, the circuit shown in FIG. 1 operates in a manner known per se on the principle of phase angle control, which, in this case, means that at the beginning of each half cycle of the ac voltage, the two thyristors 42, 44 remain blocked for a specified time interval, more particularly, until a voltage corresponding to the switching threshold of Zener diode 34 is reached on the output side of auxiliary voltage source 12.

If transistor 24 is made conductive by the level at the output of initiator 10 and if, at the same time, there is a positive half cycle at the output of ac voltage source 18, a control current indicated by a continuous line flows from terminal 14 via rectifier bridge 20, auxiliary voltage source 12, emitter/collector path of transistor 24, Zener diode 34 and diode 40 to the control electrode of thyristor 44 and from there via the cathode of thyristor 44 and load 46 back to the negative terminal of ac voltage source 18, as shown in FIGS. 1a, once capacitor 32 is charged via the switchable path of transistor 24 and diode 30, and the switching threshold of Zener diode 34 is reached. Thyristor 44 is thereby brought into the conducting state and a load current indicated by a dot-and-dash line can then flow through the series connection comprising thyristor 44, load 46 and ac voltage source 18 which together form the load circuit. As in the case of the control current, the direction in which the load current flows in indicated by arrows. Once thyristor 44 is brought into the conducting state, the voltage on the input side of bridge circuit 20 collapses to the low residual voltage across the switchable path of thyristor 44 so that also auxiliary voltage source 12 cannot supply any more output voltage. The supply voltage for initiator 10 is then provided by the previously charged capacitor 32 for the remainder of the current half cycle. However, as long as there is a voltage on the input side of bridge circuit 20 and transistor 24 is blocked by a corresponding output signal of initiator 10, resistor 54 serves to generate an impressed current for initiator 10. The purpose of diode 30 is to decouple the supplying of initiator 10 with current from the triggering of the thyristors.

In a corresponding manner, thyristor 42 is brought into the conducting state during a negative half cycle of the ac voltage at ac voltage source 18, in which case, the control current and the load current flow in the directions indicated by arrows in FIG. 1b.

When the load circuit in the inventive two-wire switch is in the on-state, the anode/cathode path of one thyristor only is located in the load circuit, as is apparent from the drawings. Therefore, apart from the voltage at the load, there is only a voltage drop across the switchable path of one thyristor. This voltage is approximately 1 V. In this case, it is advantageous for the two thyristors 42, 44 connected in antiparallel relation to each other to be comparatively inexpensive, commercially available components with low space requirement. It is also expedient for the switching transistor 24 to be decoupled from the high ac voltage by diodes 38, 40 of the decoupling circuit and to only have to switch the relatively low voltage of approximately 10 V at the output of auxiliary voltage source 12. The circuit will, however, only function if the maximum operating voltage of diodes 38, 40 is higher than the ac voltage. This requirement is met by many small and moderately priced semiconductor diodes which are commercially available.

Figure 2:
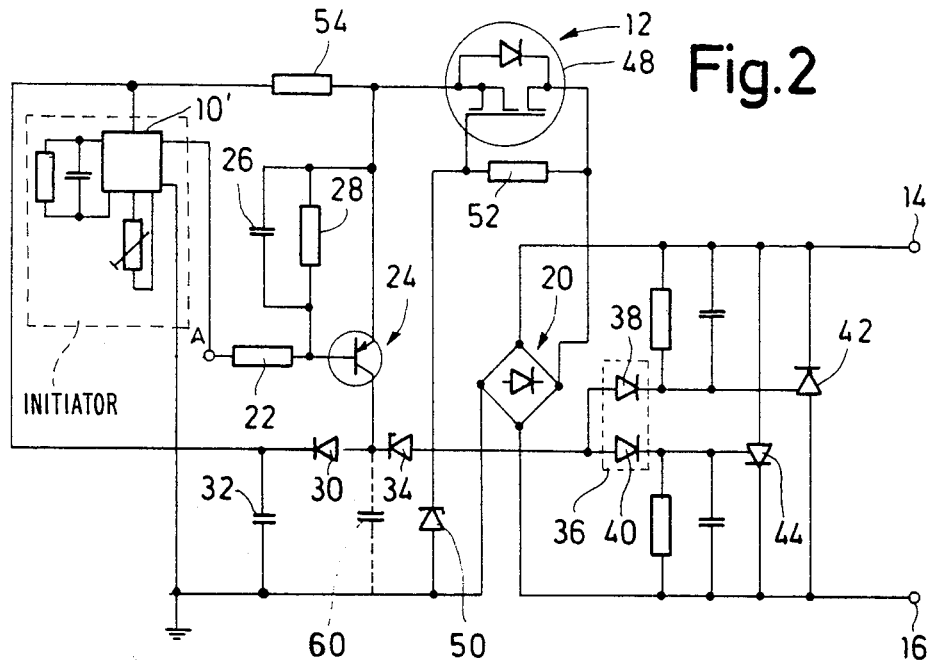
FIG. 2 is a circuit diagram of a further two-wire switch according to the invention.

The circuit of an inventive two-wire switch shown in FIG. 2 corresponds fully to the circuit shown in FIG. 1 with respect to the design of the load circuit and its activation. The initiator 10 shown only diagrammatically in FIG. 1 is, however, replaced by a commercially available integrated circuit 10' manufactured by Thomson-CSF under designation TDE 0160, with the pertinent external wiring. Also, the voltage regulator, i.e., auxiliary voltage source 12, represented only by a block in FIG. 1, is illustrated in detail in FIG. 2. As shown in the drawing, auxiliary voltage source 12 comprises as main component a field-effect transistor 48 whose drain-source region is located between rectifier bridge 20 and the emitter of transistor 24 and whose gate electrode is connected to the other terminal of bridge 20—on the output side—via a Zener diode 50. Also, a resistor 52 is arranged in parallel with the gate-drain region of transistor 48.

Transistor 48 of the auxiliary voltage source shown in FIG. 2 is brought into the conducting state on the output side of bridge 20, at each half cycle, at least within the conducting angle provided by the phase angle control, and Zener diode 50 limits the voltage effective at its gate electrode to a specified value. In this way, a pulsating dc voltage with a relatively low amplitude of, for example, approximately 10 V, is made available on the output side of transistor 48 and with resistor 54 a substantially constant current (impressed current) is obtained therefrom to supply integrated circuit 10'.

Figure 3:
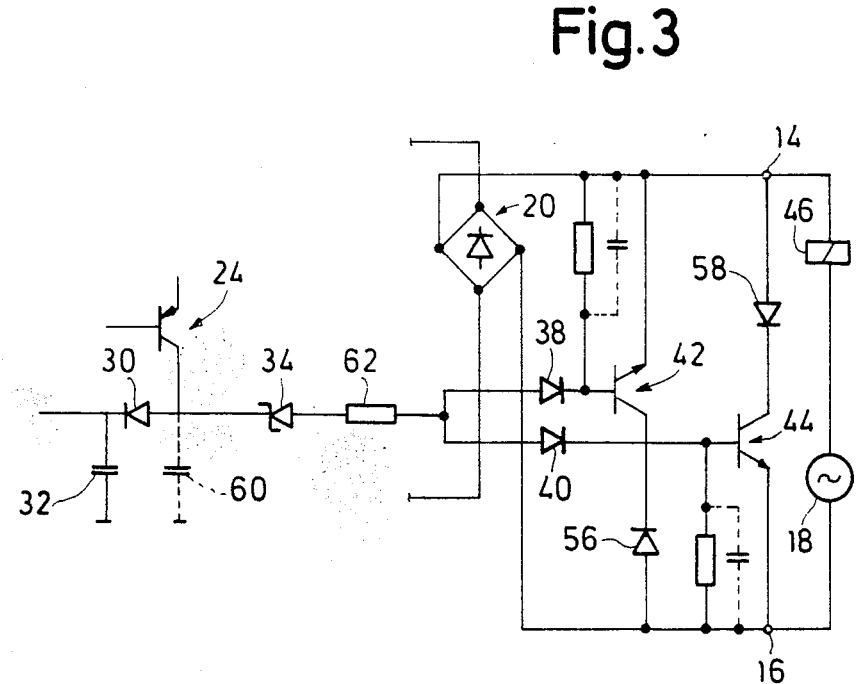
FIG. 3 is a partial circuit diagram of a further two-wire switch according to the invention.

FIG. 3 shows a further variant of an inventive two-wire switch, more particularly, only the circuit section on the input side of the bridge, with the pertinent components of the control current circuit. In FIG. 3, thyristors 42, 44 of the circuits shown in FIGS. 1 and 2 have been replaced by transistors 42, 44 which are protected against incorrect poling by diodes 56, 58 at their collector terminal. Also, a base series resistor 62 is connected between Zener diode 34 and diodes 38, 40. Other than that, the two-wire switch shown in FIG. 3 is principally of the same design on the output side of the bridge as that described with reference to FIG. 1.

In connection with the circuits shown in FIGS. 2 and 3, it is to be noted that these include a further capacitor 60, indicated by a dashed line, between the collector of transistor 24 and reference potential. This is to show that a separate capacitor may be provided for the control current circuit if this is required from a technical standpoint. One capacitor only—capacitor 32 in the illustrated embodiments—is however, usually adequate as charge storage device for the auxiliary voltage and as capacitor for the control current circuit.

What is claimed is:

1. A two-wire switch for connecting a load to an AC voltage source comprising:
   a bridge rectifier circuit having an input coupled to said AC voltage source;
   an initiator;
   a semiconductor circuit connected on the output side of said bridge circuit, having an input coupled to said initiator, and having a switchable semiconductor path which can be brought into the conducting state by operation of said initiator;
   controllable switch means, having a control electrode located in a control current circuit including said switchable semiconductor path, for delivering power from said AC voltage source to said load;
   a capacitor coupled to said initiator to supply power thereto; and
   auxiliary voltage source means, having an output coupled to said capacitor and said initiator and having an input coupled to an output of said bridge circuit to receive power therefrom, for generating a pulsating DC voltage as auxiliary voltage to power said initiator and charge said capacitor, whereby said capacitor acts as a charge storage device and powers said initiator when the pulsating DC voltage of said auxiliary voltage source is inadequate to power said initiator.

2. A two-wire switch as set forth in claim 1 further comprising a threshold element located in said control current circuit between said control electrode of said controllable switch means and said switchable semiconductor path to substantially reduce the voltage applied to said control electrode.

3. A two-wire switch as set forth in claim 2 wherein said controllable switch means comprises first and second thyristors connected in antiparallel relation to each other.

4. A two-wire switch as set forth in claim 3 wherein said controllable switch means further comprises:
   a first diode connected between said control electrode and the gate of said first thyristor; and
   a second diode connected between said control electrode and the gate of said second thyristor, said first and second diodes being poled in the same direction in relation to said threshold element.

5. A two-wire switch as set forth in claim 1 wherein said threshold elemen is a Zener diode.

6. A two-wire switch as set forth in claim 2 wherein said controllable switch means comprises a first transistor, a first diode at the collector terminal of said first transistor with a polarity to protect against incorrect poling of said first transistor, a second transistor and a second diode at the collector terminal of said second transistor with a polarity to protect against incorrect poling of said second transistor, said first transistor connected in antiparallel relation to said second transistor; and further comprising a third diode coupling the base of said second transistor to said threshold element and a fourth diode coupling the base of said first transistor to said threshold element, said third and fourth diodes being poled in the same direction in relation to said threshold element.

7. A two-wire switch as set forth in claim 1 wherein said auxiliary voltage source includes a transistor having an input coupled to the output of said bridge circuit to derive power therefrom.

8. A two-wire switch as set forth in claim 2 wherein said auxiliary voltage source includes a transistor having an input coupled to the output of said bridge circuit to derive power therefrom.

9. A two-wire switch for connecting a load to an AC voltage source, comprising:
   an initiator;
   controllable switch means for delivering power from said AC voltage source to said load; said ac voltage source, said switch means, said load and ground forming a series output circuit;
   a semiconductor circuit having a control input coupled to said initiator and having switchable semiconductor output path means for activating said switch means in response to a signal applied by said initiator to said control input of said semiconductor circuit;
   a bridge rectifier circuit having an input coupled to said AC voltage source;
   a capacitor coupled to a power input port of said initiator; and
   auxiliary voltage source means, located entirely out of said series output circuit and having an output coupled to said capacitor and said initiator and an input connected to receive current from said bridge rectifier circuit, for continuously generating a pulsating DC voltage which powers said initiator and charges said capacitor, whereby said capacitor acts as a charge storage device and powers said initiator when the pulsating DC voltage of said auxiliary voltage source is inadequate to power said initiator.

10. A two-wire switch as set forth in claim 9 wherein the output of said auxiliary voltage source is coupled to said semiconductor circuit to supply current to said switchable semiconductor output path means.

11. A two-wire switch as set forth in claim 10 further comprising a threshold element, located between said controllable switch means and said switchable semiconductor output path means, to limit the voltage activating said switch means.

* * * * *